United States Patent
Vietzke et al.

(10) Patent No.: US 12,471,396 B2
(45) Date of Patent: Nov. 11, 2025

(54) IMAGE SENSOR DEVICE

(71) Applicant: Infineon Technologies AG, Neubiberg (DE)

(72) Inventors: Dirk Vietzke, Vaterstetten (DE); Tobias Mono, Dresden (DE); Stefano Parascandola, Dresden (DE); Dirk Offenberg, Dresden (DE); Alfred Sigl, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 503 days.

(21) Appl. No.: 17/938,840

(22) Filed: Oct. 7, 2022

(65) Prior Publication Data

US 2023/0115183 A1    Apr. 13, 2023

(30) Foreign Application Priority Data

Oct. 11, 2021   (EP) ..................................... 21201954

(51) Int. Cl.
    H10F 39/00 (2025.01)

(52) U.S. Cl.
    CPC ....... H10F 39/8057 (2025.01); H10F 39/024 (2025.01)

(58) Field of Classification Search
    CPC .. H10F 39/8057; H10F 39/024; H10F 39/199; H10F 39/8067; H10F 39/803
    See application file for complete search history.

(56) References Cited

U.S. PATENT DOCUMENTS

| | | | | |
|---|---|---|---|---|
| 9,276,031 B2* | 3/2016 | Wan | ............... | H10F 39/8033 |
| 9,748,298 B2* | 8/2017 | Lenchenkov | ......... | H10F 39/014 |
| 9,812,483 B2* | 11/2017 | Chen | ............... | H10F 39/182 |
| 2012/0273854 A1* | 11/2012 | Velichko | ............ | H10F 39/8033 |
| | | | | 257/E21.334 |
| 2014/0327051 A1* | 11/2014 | Ahn | ............... | H10F 39/199 |
| | | | | 438/69 |
| 2016/0111461 A1* | 4/2016 | Ahn | ............... | H10F 39/8037 |
| | | | | 257/225 |
| 2020/0381465 A1* | 12/2020 | Lin | ............... | H10F 39/8063 |
| 2021/0014438 A1* | 1/2021 | Yang | ............... | H10F 39/186 |
| 2021/0082975 A1 | 3/2021 | Chen et al. | | |
| 2021/0400225 A1* | 12/2021 | Manda | ............... | H10F 39/80373 |
| 2022/0320174 A1* | 10/2022 | Yang | ............... | H10F 39/811 |
| 2022/0392935 A1* | 12/2022 | Lee | ............... | H10F 39/806 |

FOREIGN PATENT DOCUMENTS

WO   2020/137370 A1   7/2020

* cited by examiner

*Primary Examiner* — Bac H Au
(74) *Attorney, Agent, or Firm* — Harrity & Harrity, LLP (57) ABSTRACT

An image sensor device includes a pixel. The pixel includes a semiconductor layer having a first surface. A photodiode is formed in the semiconductor layer and is configured to generate charge carriers based on light reaching the photodiode. A storage node is formed in the semiconductor layer, the storage node being arranged so that charge carriers generated in the photodiode are transferred to the storage node. A light-shielding structure is formed in the semiconductor layer and is disposed at least between the first surface of the semiconductor layer and the storage node so as to prevent at least part of the light travelling in the semiconductor layer away from the first surface from reaching the storage node.

21 Claims, 4 Drawing Sheets

IMAGE SENSOR DEVICE

CROSS REFERENCE TO RELATED APPLICATION

This application claims priority to European Patent Application No. 21201954 filed on Oct. 11, 2021, the content of which is incorporated by reference herein in its entirety.

TECHNICAL FIELD

This disclosure relates to the field of image sensor devices.

BACKGROUND

Image sensor devices are widely used, e.g., in cameras of consumer electronics or automotive applications. One major problem of image sensor devices is the parasitic light sensitivity (PLS) found in image sensor pixels. PLS is the ratio of the light sensitivity of a pixel storage node and the light sensitivity of a photodiode. The higher 1/PLS the better are the readout results provided by the storage node.

PLS is generated by light incident on the storage node. Photons reaching the storage node can generate electrons which will alter the charge collected during integration time from the photodiode. This additional charge (which is not from the photodiode) is one of the major causes of noise.

There are different methods to protect the storage node of a pixel against photons reaching the storage node. These methods all have different drawbacks. A thicker epitaxial layer can improve 1/PLS but may lead to process integration issues. Design measures can be applied to the pixel layout. However, this can lead to an allover increase of the pixel area or impact other pixel properties. Optical measures like reducing the light scattering will lead to a lower quantum efficiency of the pixel.

SUMMARY

According to an aspect of the disclosure an image sensor device includes a pixel. The pixel includes a semiconductor layer having a first surface. A photodiode is formed in the semiconductor layer and is configured to generate charge carriers based on light reaching the photodiode. A storage node is formed in the semiconductor layer, the storage node being arranged so that charge carriers generated in the photodiode are transferred to the storage node. A light-shielding structure is formed in the semiconductor layer and is disposed at least between the first surface of the semiconductor layer and the storage node so as to prevent at least part of the light travelling in the semiconductor layer away from the first surface from reaching the storage node.

According to another aspect of the disclosure, a method of manufacturing an image sensor device including a pixel is disclosed. A semiconductor layer of the pixel is formed. The semiconductor layer has a first surface. A photodiode of the pixel is formed in the semiconductor layer. The photodiode is configured to generate charge carriers based on light reaching the photodiode. A storage node of the pixel is formed in the semiconductor layer. The storage node is arranged so that charge carriers generated in the photodiode are transferred to the storage node. A light-shielding structure of the pixel is formed in the semiconductor layer. The light-shielding structure is disposed at least between the first surface of the semiconductor layer and the storage node so as to prevent at least part of the light travelling in the semiconductor layer away from the first surface from reaching the storage node.

BRIEF DESCRIPTION OF THE DRAWINGS

The elements of the drawings are not necessarily to scale relative to each other. Like reference numerals designate corresponding similar parts. The features of the various illustrated implementations can be combined unless they exclude each other and/or can be selectively omitted if not described to be necessarily required. Implementations are depicted in the drawings and are exemplarily detailed in the description which follows.

DETAILED DESCRIPTION

As used in this specification, layers or elements illustrated as adjacent layers or elements do not necessarily be directly contacted together; intervening elements or layers may be provided between such layers or elements. However, in accordance with the disclosure, elements or layers illustrated as adjacent layers or elements may in particular be directly contacted together, e.g., no intervening elements or layers are provided between these layers or elements, respectively.

The words "over" or "beneath" with regard to a part, element or material layer formed or located or disposed or arranged or placed "over" or "beneath" a surface may be used herein to mean that the part, element or material layer be located (e.g., placed, formed, arranged, disposed, placed, etc.) "directly on" or "directly under", e.g., in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g., placed, formed, arranged, deposited, etc.) "indirectly on" or "indirectly under" the implied surface, with one or more additional parts, elements or layers being arranged between the implied surface and the part, element or material layer.

Figure 1:
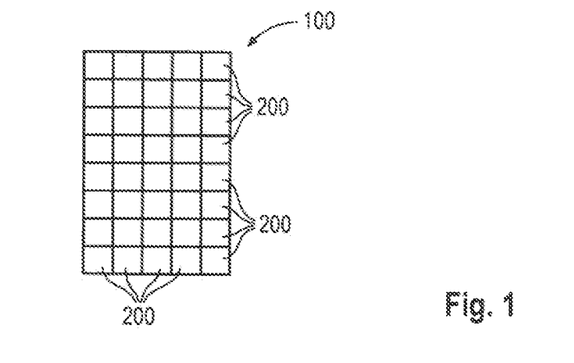
FIG. 1 is a schematic cross-sectional front view of an example of an image sensor device including a plurality of sensor pixels.

FIG. 1 illustrates a schematic front view of an image sensor device 100. The image sensor device 100 may include a plurality of pixels 200. The plurality of pixels 200 may be arranged as an array. The array of pixels 200 may represent a matrix of individual picture elements. The image sensor device 100 may, e.g., be a monolithic CMOS (Complementary Metal-Oxide-Semiconductor) image sensor.

Figure 2A:
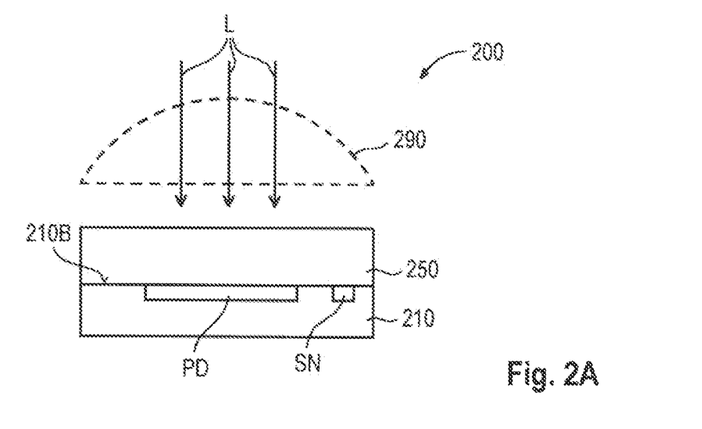
FIG. 2A is a schematic cross-sectional view of an example of a front-side illuminated pixel.

FIG. 2A is a simplified illustration of a pixel 200 of the image sensor device 100. The pixel 200 of FIG. 2A is a front-side illuminated pixel 200. A front-side illuminated pixel 200 includes a photodiode PD and a storage node SN formed in a semiconductor layer 210. A metal wiring structure 250 may be disposed over a second surface 210B of the semiconductor layer 210. The metal wiring structure 250 is configured to electrically connect each pixel 200 to external circuitry (not shown) in which the signal of each individual pixel 200 is evaluated. To this end, the metal wiring structure 250 may comprise one or more transparent dielectric layers (not shown) and metal conductors (not shown) routed on or between these dielectric layer(s).

In front-side illuminated pixels 200 the light L, after optionally passing through optical elements such as, e.g., a micro-lens 290 and/or a color filter (not shown), is incident on the second surface 210B of the semiconductor layer 210 and then reaches the photodiode PD.

As will be explained further below in greater detail, incoming light L should not reach the in-pixel storage node SN. Photons reaching the storage node SN may generate electrons which alter the amount of charge collected during integration time (e.g., during the hold mode) in the storage node SN. This additional charge impairs the charge readout results provided by the storage node SN.

Stated differently, PLS is generated by light incident on the storage node SN. However, a high 1/PLS is needed to ensure correct readout results at the storage node SN or, in other words, to ensure a low noise image sensor device 100.

Figure 2B:
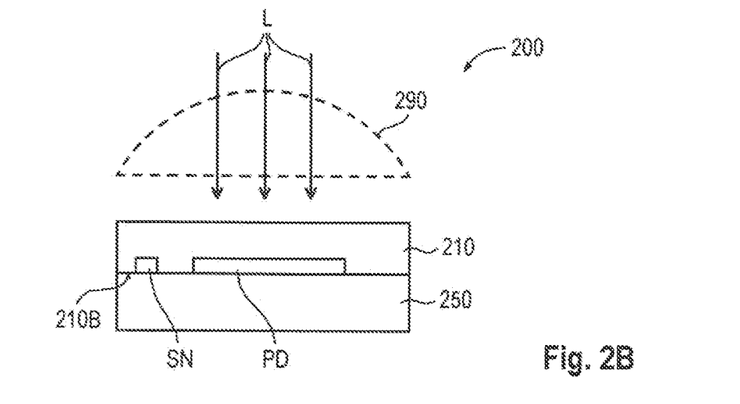
FIG. 2B is a schematic cross-sectional view of an example of a back-side illuminated pixel.

FIG. 2B illustrates a pixel 200 of a backside illuminated image sensor device 100. The backside illuminated pixel 200 may include the same elements as the front-side illuminated pixel 200 of FIG. 2A, but arranges the metal wiring structure 250 behind the semiconductor layer 210. That is, the incident light L can reach the semiconductor layer 210 without passing through the metal wiring structure 250.

The backside illumination image sensor device (FIG. 2B) offers improved sensitivity of the photodiode PD since light scattering or attenuation of light L due to the metal wiring structure 250 does not occur. With smaller pixel size this effect increases since the light capture area gained in moving the metal wiring structure 250 from the side facing the incident light to the side facing away from the incident light L is proportionally smaller for larger pixels. Therefore, the light sensitivity of high-resolution image sensor devices 100 may be improved. On the other hand, the front-side illumination approach (FIG. 2A) allows a better shielding of the storage node SN from incident light L by the metal wiring structure 250.

Therefore, the backside illumination image sensor devices 100 having pixels 200 in accordance with FIG. 2B may have an increased issue with PLS, because the storage node SN can be illuminated directly and not only by stray light as in front-side illumination image sensor devices 100 of which a pixel 200 is shown in FIG. 2A.

Referring to FIGS. 3 to 8, examples of the disclosure will be described for the example of backside illuminated pixels 200 (e.g., for backside illumination image sensor devices 100). However, as will be explained further below, the light-shielding structures exemplified below can all be used also for front-side illuminated pixels 200 (e.g., for front-side illumination image sensor devices 100). While in backside illumination image sensor devices 100 the light-shielding structures described below may prevent direct incident light to reach the storage nodes SN, in the front-side illumination image sensor devices 100 the same light-shielding structures may be used to shield the storage nodes SN from light reflected at the backside of the semiconductor layer 210 (e.g., at the side facing away from the incident light L).

Figure 3:
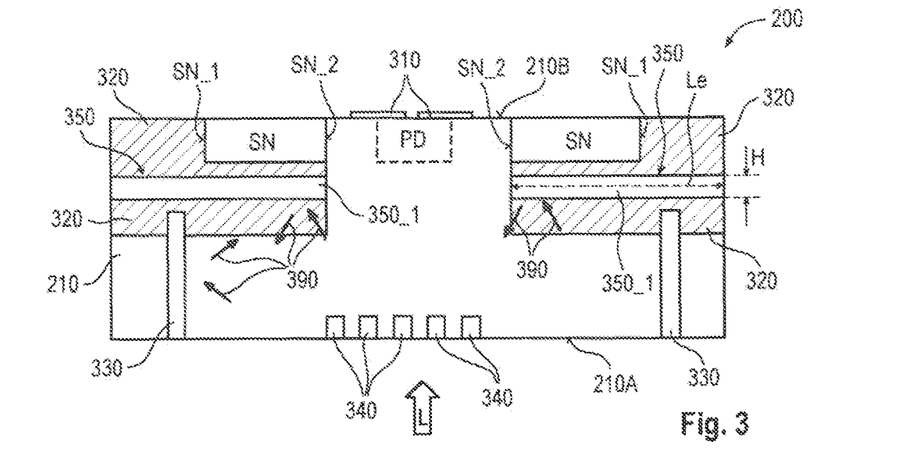
FIG. 3 is a schematic cross-sectional view of an example of a semiconductor layer of a pixel of a backside illumination image sensor device having a continuous light-shielding structure extending in a lateral direction beneath the storage node.

FIG. 3 illustrates an example of a semiconductor layer 210 of a backside illuminated pixel 200 as exemplarily shown in FIG. 2B. The semiconductor layer 210 may be an epitaxial layer. The epitaxial layer may have been grown on a substrate (not shown) in the direction from the first surface 210A towards the second surface 210B. The semiconductor layer 210 may be of any appropriate semiconductor material, e.g., Si.

A photodiode PD is formed in the semiconductor layer 210. The photodiode PD is configured to generate charge carriers based on light L reaching the photodiode PD.

Further, a storage node SN is formed in the semiconductor layer 210. The storage node SN is arranged so that charge carriers generated in the photodiode PD are transferred to the storage node SN.

For example, a transfer gate 310 may be arranged at the second surface 210B of the semiconductor layer 210. As known in the art, the charge transfer from the photodiode PD to the in-pixel storage node SN may be controlled by such transfer gate 310.

In FIG. 3 the semiconductor layer 210 is illustrated to be e.g., provided with two storage nodes SN which are arranged to both sides of the photodiode PD. Likewise, two transfer gates 310 are provided, for example. This approach allows to selectively control whether the charge generated in the photodiode PD upon light L incident on the photodiode PD is transferred to the left storage node SN and/or to the right storage node SN. In other words, the pixel 200 may be operated in at least two different modes, namely in a first mode in which the charge generated in the photodiode PD is transferred to the left storage node SN or in a second mode in which this charge is transferred to the right storage node SN. However, this functionality is optional, and throughout this disclosure, pixels 200 with only a single in-pixel storage node SN are likewise disclosed by any of the examples described herein (and, e.g., illustrated by any of the FIGS. 3 to 8).

The semiconductor layer 210 further includes a light-shielding structure 350. The light-shielding structure 350 is formed in the semiconductor layer 210 and disposed at least between the first surface 210A of the semiconductor layer and the storage node SN. The light-shielding structure 350 prevents at least a part of the light L travelling in the semiconductor layer 210 away from the first surface 210A from reaching the storage node SN.

It is to be noted that in the case of a backside illuminated pixel (FIG. 2B), the light-shielding structure 350 protects the storage node SN from direct incident light L. In the case of a front-side illuminated pixel (FIG. 2A) the incident light L would first reach the second surface 210B (after having passed the metal wiring structure 250, see FIG. 2A) and would then enter the photodiode PD before reaching the first surface 210A of the semiconductor layer 210. In this case, the light-shielding structure 350 screens the storage node SN from light reflected at the first surface 210 rather than from direct light L as in the case of the backside illuminated pixel (FIG. 2B).

The light-shielding structure 350 extends in a lateral direction. It may, e.g., extend over at least an entirety of a lateral extension of the storage node SN. In the example of FIG. 3 the light shielding structure 350 may, in a vertical projection, extend in an outer direction beyond the outer edge SN_1 of the storage node SN and/or may extend in an inner direction e.g., to the inner edge SN_2 of the storage node SN (as shown) or beyond the inner edge SN_2.

The light-shielding structure 350 may be a continuous structure, e.g., without any openings. The light-shielding structure 350 may be a plate-shaped structure. The light-shielding structure 350 may extend in another lateral direction, which is e.g., perpendicular to the lateral direction shown in FIG. 3, with respect to the extent of the storage node SN in that other lateral direction in the same manner as shown in FIG. 3.

The light-shielding structure 350 may act as a mirror. That is, photons 390 that strike the light-shielding structure 350 are reflected (as indicated by arrows). As mentioned above, these photons may be of the direct incident light L (e.g., in the case of a backside illumination sensor device 100 of FIG. 1 in combination with FIG. 2B) or may be photons which are reflected from the first surface 210A of the semiconductor layer 210 (e.g., in the case of a front-side illumination sensor device 100 of FIG. 1 in combination with FIG. 2A).

In one example the light-shielding structure 350 may comprise or be formed by a buried horizontal slit 350_1. The buried horizontal slit 350_1 may have a free height H, which could be selected so that a high reflectivity is produced. Hence, the free height H may be chosen based on the wavelength of the incident light L. The free height H may be equal to or greater than or less than 100 nm, 300 nm, 500 nm, 700 nm or 900 nm. For example, free heights H of 235 nm or 700 nm may be chosen.

The length Le of the light-shielding structure 350 (e.g., of the buried slit 350_1 as shown for example in FIG. 3) can be equal to or greater than or less than 0.5 µm, 1 µm, 2 µm, 3 µm,     4 µm, 5 µm, 6 µm or 7 µm. Le may depend on the size of the pixel 200. The smaller the pixel 200 is, the shorter Le can be.

The semiconductor layer 210 may include a doped region 320 adjacent to the storage node SN. The doped region 320 is configured to electrically shield the storage node SN to enhance charge carrier transfer from the photodiode PD to the storage node SN. The storage node SN may be at least partly embedded in the doped region 320. For example, the doped region 320 may completely cover the outer edge SN_1 and/or may completely or partly cover the bottom of the storage node SN.

Typically, the doped region 320 has virtually no optical protection effect for the storage node SN. That is, the optical protection of the storage node SN against incident light L may be provided mainly or exclusively by the light-shielding structure 350, while the electrical environment (e.g., electrical shielding) of the storage node SN is governed by the doped region 320. The doped region 320 is referred to in the art as a well isolation region of the storage node SN.

In some examples the light-shielding structure 350 may extend partially or completely within the doped region 320. For instance, the longitudinal extension of the doped region 320 may be aligned to the longitudinal extension (e.g., the length Le) of the light-shieling structure 350. Further, as shown by way of example in FIG. 3, the inner edge SN_2 of the storage node SN and/or the inner edge of the light-shielding structure 350 and/or the inner edge of the doped region 320 may be aligned with each other.

The semiconductor layer 210 may further be provided with one or more backside trenches 330. The backside trenches 330 may be vertical trenches effective to avoid optical crosstalk between adjacent pixels 200. Differently stated, they may be used for optical isolation of adjacent photodiodes PD or pixels 200 in the image sensor device 100 (FIG. 1).

The vertical trenches 330 may be implemented as hollow trenches. Similar as the horizontal trenches (slits) 350_1 which may be used as light-shielding structures 350, the backside trenches 330 may be effective to reflect photons 390 striking the backside trenches 330 back towards a center region of the pixel 200.

The backside trenches 330 may be formed in the first surface 210A (e.g., the backside surface) of the semiconductor layer 210 and may extend e.g., into the doped region 320 of the semiconductor layer 210.

The semiconductor layer 210 may be further provided with scattering elements 340. The scattering elements 340 may be arranged at the first surface 210A of the semiconductor layer 210. The scattering elements 340 may form an optical grid. For example, the scattering elements 340 may be formed by shallow backside trenches. The shallow backside trenches may be produced the same way as the backside trenches 330 are produced. However, the depth of the shallow backside trenches forming the scattering elements 340 is considerably smaller than the depth of the backside trenches 330 used for prevention of crosstalk.

During operation incoming light L reaching the photodiode PD causes charge carriers to be created in the photodiode PD. To this end, the photodiode PD may include one or more pn-junctions, as known in the art.

The charge carriers created in the photodiode PD are transferred to one or more storage node SN. The transfer may be triggered by a potential applied to the transfer gate(s) 310. Further, the doped region 320 is optimized for a field distribution to transport the charge carriers from the active region of the photodiode PD to the storage node(s) SN. In other words, the doped region 320 may be configured to provide for an electric field distribution in the vicinity of the active region of the photodiode PD and the storage node(s) SN which is optimized to deplete the active region.

For example, the semiconductor layer 210 may be a high resistivity p$^-$-type layer, e.g., an epitaxial layer. The doped region 320 (isolation well) may be formed by a moderately doped p-type region. The storage node SN may comprise an n-type region. The transfer gate(s) 310 may, e.g., be implemented by poly-Si gates.

The light-shielding structure 350 may, e.g., be formed by using a silicon-on-nothing (SON) process. The SON process allows the formation of buried plate-shaped trenches (slits) 350_1, cavities, etc. The SON process offers a thickness control as fine as the resolution of the epitaxial process (e.g., about 1 nm). Therefore, SON allows to set the height H of the light-shielding structure 350 (e.g., plate-shaped horizontal slit 350_1) with high accuracy. This also allows to tune the reflective mirror characteristics of the light-shielding structure 350 to specific wavelengths, if desired.

Another example method of forming the light-shielding structure 350 is the epitaxial lateral overgrowth (ELOG) process.

Figure 4:
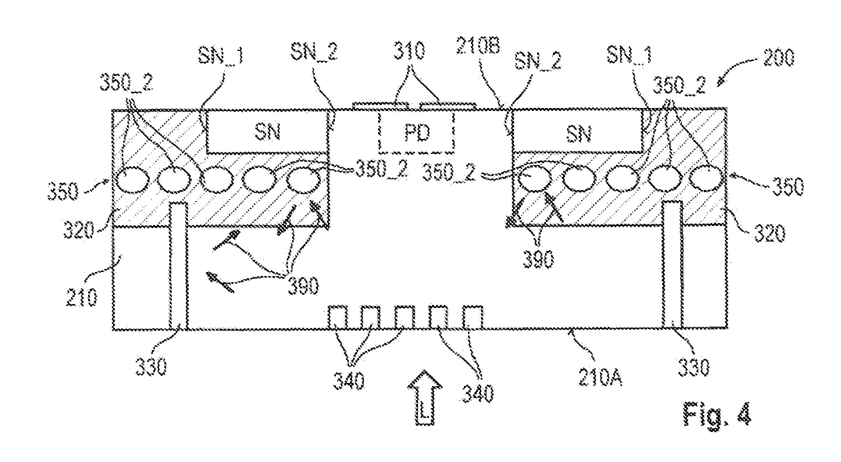
FIG. 4 is a schematic cross-sectional view of an example of a semiconductor layer of a pixel of a backside illumination image sensor device having a light-shielding structure formed by a row of buried cavities extending in a lateral direction beneath the storage node.

FIG. 4 illustrates an example of a semiconductor layer 210 of a further example pixel 200. In the semiconductor layer 210 of FIG. 4 the light-shielding structure(s) 350 is (are) formed by row(s) of buried cavities 350_2. The cavities 350_2 may be hollow, e.g., may be formed as empty spaces in the semiconductor layer 210. The cavities 350_2 are separated from each other, e.g., are not continuous. The cavities 350_2 may have a round-shaped cross section. The dimensions of the cavities 350_2 in the vertical direction may correspond to the height H of the light-shielding structure 350 of FIG. 3. The lateral dimension (e.g., diameter) of the buried cavities 350_2 may be equal to or greater than or less than 0.9 µm, 0.7 µm, 0.5 µm or 0.3 µm in one or both lateral dimensions. The distance between adjacent buried cavities 350_2 may be equal to or greater than or less than 50 nm or 100 nm or 150 nm or 200 nm.

The functionality of light-shielding structure 350 formed by buried cavities 350_2 is similar to the light shielding functionality as described above for a light-shielding structure 350 comprising a buried plate-shaped slit 350_1. Further, the extension of the row of buried cavities 350_2 in the lateral direction and/or with regard to the extension of the storage node SN and/or of the doped region 320 may be identical to the corresponding features described in conjunction of FIG. 3, and reference is made to the above to avoid reiteration.

Figure 5:
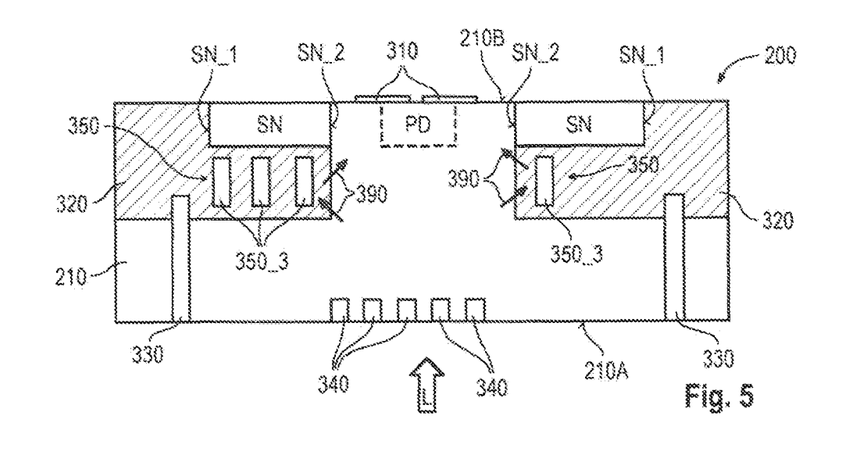
FIG. 5 is a schematic cross-sectional view of an example of a semiconductor layer of a pixel of a backside illumination image sensor device having a light-shielding structure formed by a row of buried cavities shaped as buried trenches extending in a lateral direction beneath the storage node or formed by a single buried reflector trench.

FIG. 5 illustrates a semiconductor layer 210 which is similar to the semiconductor layer 210 of FIG. 3 or 4 with the exception that the light-shielding structure 350 is formed by one or a plurality of buried vertical trenches 350_3. Each buried vertical trench 350_3 is oriented in a vertical direction. If there is more than one buried vertical trench 350_3 (see left side of FIG. 5), the buried vertical trenches 350_3 are laterally spaced apart from each other. The buried vertical trenches 350_3 may be hollow, e.g., may form empty spaces in the semiconductor layer 210.

The buried vertical trenches 350_3 may have a width dimension which may, e.g., be in the range of the width (lateral dimensions) specified for the buried cavities 350_2. The height of the buried vertical trenches 350_3 may, e.g., be greater than their width and may, e.g., be in the range between 100 nm and a few µm. The distance between adjacent buried vertical trenches 350_3 can be chosen depending on the geometric condition that oblique incident light entering the region between neighboring buried vertical trenches 350_3 must always strike the surface of a buried vertical trench 350_3. For instance, the distance between adjacent buried vertical trenches 350_3 may be chosen similar to the range specified above for the distance between adjacent buried cavities 350_2.

As apparent from the right portion of FIG. 5, only a single buried vertical trench 350_3 may protect the majority or (if properly positioned and dimensioned) virtually the entirety of the storage node SN from oblique incident light L.

Further, a single or a plurality of buried vertical trenches 350_3 may be effective to reflect oblique incident light L (see photons 390) back to the photodiode (PD). This simultaneously enhances the quantum efficiency (QE) of the pixel 200.

In FIG. 5 the buried vertical trenches 350_3 are shown to extend over at least 50%, 60%, 70%, 80% or 90% of the vertical dimension of the doped region 320. In other examples it is possible that the vertical dimension (height) of the buried vertical trenches 350_3 is equal to or greater than the vertical dimension of the doped region 320. The buried vertical trenches 350_3 may project in the downward direction out of the doped region 320.

The row of buried cavities (e.g., either round-shaped buried cavities 350_2 or buried vertical trenches 350_3) may, e.g., be produced by one or more of the processes described in conjunction with the light-shielding structure 350 of FIG. 3.

Figure 6:
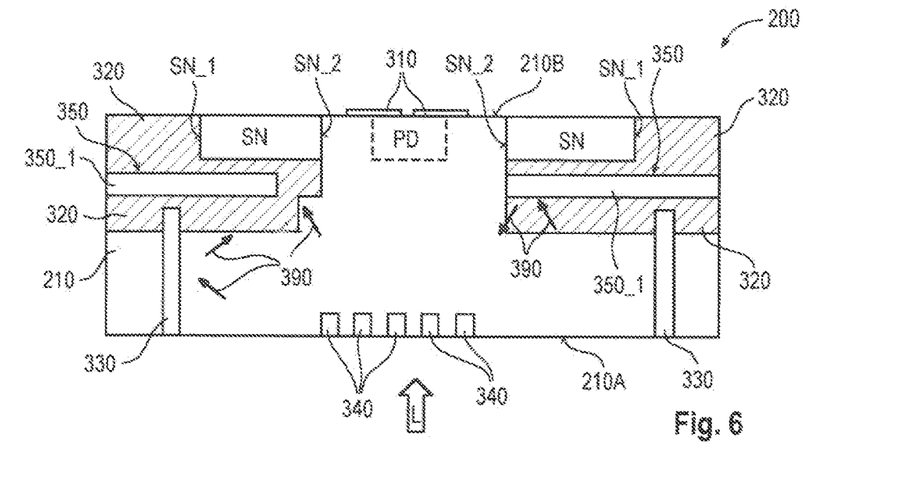
FIG. 6 is a schematic cross-sectional view of an example of a semiconductor layer of a pixel of a backside illumination image sensor device having a continuous light-shielding structure extending in a lateral direction beneath the storage node over a part of the lateral extension of storage node.

FIG. 6 illustrates another variant of designing the light-shielding structure 350 in the semiconductor layer 210. Similar to the example of FIG. 3, the light-shielding structure(s) 350 is (are) formed as a horizontal buried slit 350_1. Referring to the example shown at the left side of FIG. 6, the horizontal buried slit 350_1 ends in the inward direction under a distance to the inner edge SN_2 of the storage node SN. This would, however, create an optically unprotected area in the storage node SN. The inner edge of the doped region 320 may be provided with a step-shaped outline.

Figure 7:
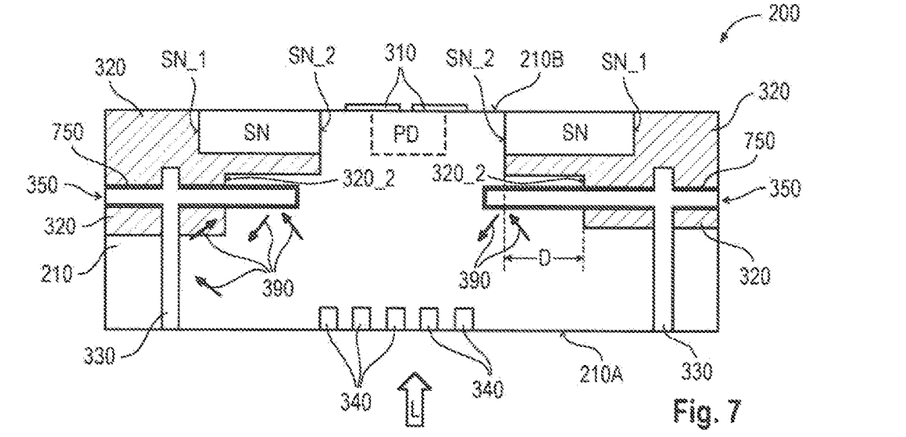
FIG. 7 is a schematic cross-sectional view of an example of a semiconductor layer of a pixel of a backside illumination image sensor device having a continuous light-shielding structure formed by a buried horizontal slit that comprises an electrically conductive coating.

In FIG. 7 the semiconductor layer 210 of a further example pixel 200 is provided with a light-shielding structure 350 (e.g., formed as a buried horizontal slit 350_1), which protrudes out of the doped region 320 in the inward direction. In the example shown, this may be due to portion 320_2 of the inner edge of the doped region 320 which is located offset from the inner edge SN_2 of the storage node SN by a distance D. In this case, the electrical isolation (shielding) of the storage node SN may, e.g., be incomplete or not optimized for most effective charge carrier transfer from the photodiode PD to the storage node SN.

In FIG. 7, the doped region 320 still covers the entire extension of the storage node SN at the bottom thereof. However, it is also possible that the doped region 320 may not cover the entire extension of the storage node SN at the bottom thereof (not shown), e.g., that the storage node SN may, at least over a part of its lateral extension, be directly contacted to the body material of the semiconductor layer 210.

In this and also in other examples described above the light-shielding structure 350 (e.g., the buried horizontal slit 350_1) may comprise an electrically conductive coating 750 arranged on a wall of the buried horizontal slit 350_1. The electrically conductive coating 750 may be configured to provide for the electrical shielding of the storage node SN, e.g., may compensate the partial or fully lack of the doped region 320 beneath the storage node SN. Further, the electrically conductive coating 750 may be configured to reflect incoming light L impinging on the wall of the buried horizontal slit 350_1.

Hence, besides its effectiveness as an optical shield (mirror) the light-shielding structure 350 of FIG. 7 (having an electrically conductive coating 750) may additionally provide for or assist in electrical shielding. This effect of electrical shielding may also be exploited in the examples where the light-shielding structure 350 fully extends within the doped region 320.

The electrically conductive coating 750 may be of a metal material. The material of the electrically conductive coating may be introduced into the horizontal buried slit 350_1 either during fabrication of the slits 350_1 and/or via the backside trenches 330. In the latter case the backside trenches 330 connect to the horizontal buried slits 350_1 of the light-shielding structure 350 to allow introduction of the electrically conductive material (e.g., metal) after formation of the horizontal buried slits 350_1.

Figure 8:
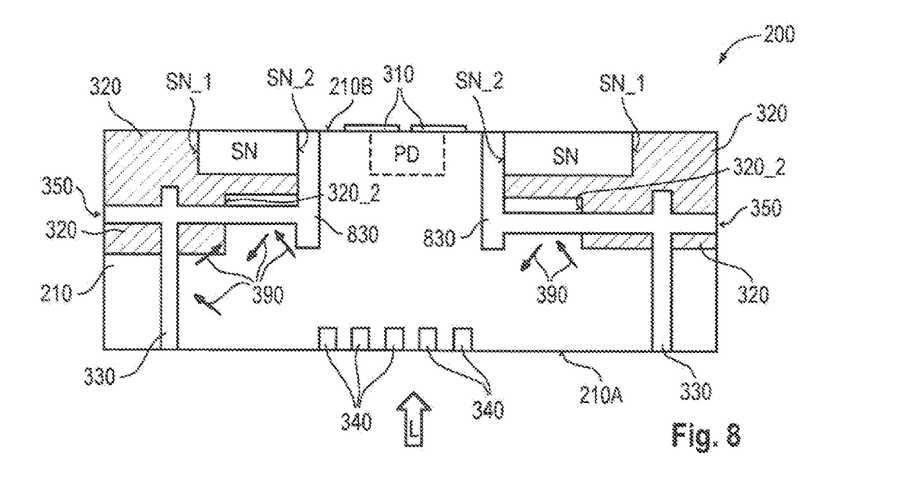
FIG. 8 is a schematic cross-sectional view of an example of a semiconductor layer of a pixel of a backside illumination image sensor device having a trench arranged vertically in the semiconductor layer between the photodiode and the storage node.

FIG. 8 illustrates a semiconductor layer 210 of a pixel 200 which is provided with a trench 830 (or with a plurality of trenches 830) arranged vertically in the semiconductor layer 210 between the photodiode PD and the storage node SN. The vertical trench(es) 830 may protect the storage node(s) SN from oblique light. The vertical trenches 830 may extend over a part or the entire depth of the storage node(s) SN and/or, additionally, over a part of or the entire depth of the doped region 320 (either the depth at the inner edge portion of the doped region 320 (which may be aligned with the inner edge SN_2 of the storage node SN) or the depth of the bottom level of the doped region 320). Note that charge carriers generated in the photodiode PD may be transferred to the storage node(s) SN via the transfer gates 310 at the second surface 210B.

As illustrated in FIG. 8, the vertical trench 830 may, e.g., be in communication with the light-shielding structure 350, which may, e.g., be formed by a horizontal slit 350_1 as mentioned before. In this and other examples, the storage node SN may be surrounded at its bottom extension (in one or both lateral dimensions) and at its inner edge SN_2 partly or completely by the horizontal and vertical light-shielding structure 350, 380.

In one example the vertical trench 830 may also be coated by an electrically conductive coating such as, e.g., the electrically conductive coating 750, as shown in FIG. 7.

It is to be noted that distinct features illustrated and/or described in conjunction with the FIGS. 3 to 8 can be combined with each other unless such combination is excluded for technical reasons. In other words, features illustrated and/or described in the examples not tied to the specific example, which is only used for purpose of explanation, but may be implemented in other and more generalized implementations. Further, it is to be noted that the examples and features described above may be implemented both in backside illumination image sensor devices 100 (see FIGS. 1 and 2B) and in front-side illumination image sensor devices (see FIG. 1 and FIG. 2A).

That is, if the semiconductor layer is an epitaxial layer, the image sensor device including a plurality of sensor pixels may comprise an epitaxial semiconductor layer; a photodiode of a sensor pixel, the photodiode being formed in the epitaxial layer; a storage node of the sensor pixel, the storage node being formed in the epitaxial layer, the storage node being disposed e.g., adjacent the photodiode so that charge carriers generated in the photodiode can be transferred to the storage node; and a light-shielding structure of the sensor pixel, the light-shielding structure being formed in the epitaxial layer and extends below the storage node in a lateral direction. The light-shielding structure may be configured in different geometries and implementations as explained above.

Figure 9:
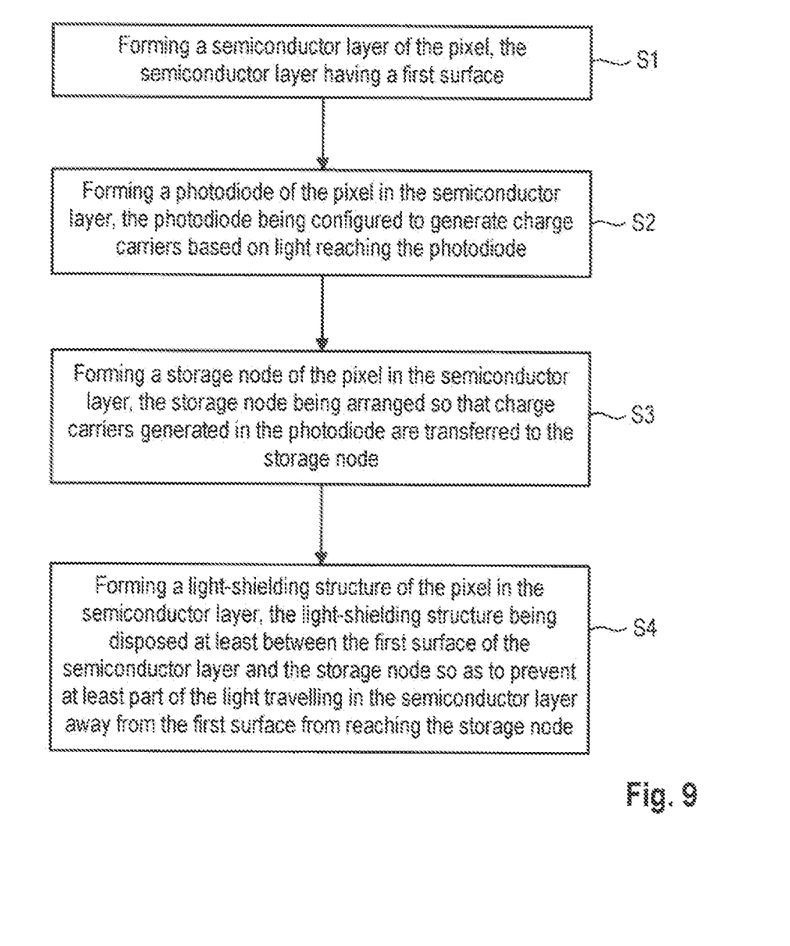
FIG. 9 is flowchart illustrating stages of a method of manufacturing an example image sensor device comprising a pixel.

Referring to FIG. 9, at S1 a semiconductor layer of a pixel is formed, wherein the semiconductor layer has a first surface.

At S2 a photodiode of the pixel in the semiconductor layer is formed, wherein the photodiode being configured to generate charge carriers based on light reaching the photodiode.

At S3 a storage node of the pixel is formed in the semiconductor layer, wherein the storage node being arranged so that charge carriers generated in photodiode are transferred to the storage node.

At S4 a light-shielding structure of the pixel is formed in the semiconductor layer, wherein the light-shielding structure being disposed at least between the first surface of the semiconductor layer and the storage node so as to prevent at least part of the light travelling in the semiconductor layer away from the first surface from reaching the storage node.

As mentioned above, the light travelling away in the semiconductor layer from the first surface may either be incoming light (backside illumination device of FIGS. 1 and 2B) or may be reflection light (front-side illumination device of FIGS. 1 and 2A).

ASPECTS

The following aspects pertain to further aspects of the disclosure:

Aspect 1 is an image sensor device includes a pixel. The pixel includes a semiconductor layer having a first surface. A photodiode is formed in the semiconductor layer and is configured to generate charge carriers based on light reaching the photodiode. A storage node is formed in the semiconductor layer, the storage node being arranged so that charge carriers generated in the photodiode are transferred to the storage node. A light-shielding structure is formed in the semiconductor layer and is disposed at least between the first surface of the semiconductor layer and the storage node so as to prevent at least part of the light travelling in the semiconductor layer away from the first surface from reaching the storage node.

In Aspect 2, the subject matter of Aspect 1 can optionally include wherein the image sensor device is a backside illumination image sensor device, the first surface being the surface at which the incoming light enters the semiconductor layer.

In Aspect 3, the subject matter of Aspect 1 can optionally include wherein the image sensor device is a front-side illumination image sensor device, the semiconductor layer having a second surface opposite the first surface, the second surface being the surface at which the incoming light enters the semiconductor layer.

In Aspect 4, the subject matter of any preceding Aspect can optionally include wherein the light-shielding structure stretches in a lateral direction over at least an entirety of a lateral extension of the storage node.

In Aspect 5, the subject matter of any preceding Aspect can optionally include wherein the light-shielding structure comprises a buried horizontal slit.

In Aspect 6, the subject matter of any preceding Aspect can optionally include wherein the buried horizontal slit comprises an electrically conductive coating arranged on a wall of the slit and configured to reflect incoming light impinging upon the wall.

In Aspect 7, the subject matter of any preceding Aspect can optionally include wherein the light-shielding structure comprises a row of buried cavities.

In Aspect 8, the subject matter of Aspect 7 can optionally include wherein the row of buried cavities comprises buried trenches, wherein each trench is oriented in a vertical direction and the trenches are laterally spaced apart from each other.

In Aspect 9, the subject matter of Aspect 7 or 8 can optionally include wherein the row of buried cavities comprises buried cavities having a round-shaped cross-section, wherein the cavities are laterally spaced apart from each other.

In Aspect 10, the subject matter of any of the preceding Aspects can optionally further include a doped region of the semiconductor layer, the doped region being adjacent to the storage node and configured to electrically shield the storage node to enhance charge carrier transfer from the photodiode to the storage node, wherein the light-shielding structure extends partially or completely within the doped region.

In Aspect 11, the subject matter of Aspect 10 can optionally further include a trench arranged vertically in the semiconductor layer between the photodiode and the storage node.

Aspect 12 is a method of manufacturing an image sensor device comprising a pixel is disclosed. A semiconductor layer of the pixel is formed. The semiconductor layer has a first surface. A photodiode of the pixel is formed in the semiconductor layer. The photodiode is configured to generate charge carriers based on light reaching the photodiode. A storage node of the pixel is formed in the semiconductor layer. The storage node is arranged so that charge carriers generated in the photodiode are transferred to the storage node. A light-shielding structure of the pixel is formed in the semiconductor layer. The light-shielding structure is disposed at least between the first surface of the semiconductor layer and the storage node so as to prevent at least part of the light travelling in the semiconductor layer away from the first surface from reaching the storage node.

In Aspect 13, the subject matter of Aspect 12 can optionally include wherein the light-shielding structure is formed by using a silicon-on-nothing process.

In Aspect 14, the subject matter of Aspect 12 can optionally include wherein the light-shielding structure is formed by using an epitaxial lateral overgrowth process.

In Aspect 15, the subject matter of any of Aspects 12 to 14 can optionally include wherein the light-shielding structure comprises a buried horizontal slit, the method further comprising introducing an electrically conductive substance into the buried horizontal slit for producing an electrically conductive coating on a wall of the slit, wherein the electrically conductive coating is configured to reflect incoming light impinging upon the wall.

Although specific implementations have been illustrated and described herein, it will be appreciated by those of ordinary skill in the art that a variety of alternate and/or equivalent implementations may be substituted for the specific implementations shown and described without departing from the scope of the present implementation. This application is intended to cover any adaptations or variations of the specific implementations discussed herein. Therefore, it is intended that this implementation be limited only by the claims and the equivalents thereof.

The invention claimed is:

1. An image sensor device, comprising:
   a pixel, the pixel comprising:
      a semiconductor layer having a first surface and a doped region;
      a photodiode formed in the semiconductor layer and being configured to generate charge carriers based on light reaching the photodiode;
      a storage node formed in the semiconductor layer, the storage node being arranged so that the charge carriers generated in the photodiode are transferred to the storage node, and the storage node being at least partially embedded in the doped region; and
      a light-shielding structure, the light-shielding structure being formed in the semiconductor layer and being disposed at least between the first surface of the semiconductor layer and the storage node so as to prevent at least part of the light traveling in the semiconductor layer away from the first surface from reaching the storage node,
      wherein the light-shielding structure is at least partially embedded in the doped region such that, in a vertical dimension of the semiconductor layer, a first portion of the doped region is arranged between the storage node and the light-shielding structure, and such that, in the vertical dimension of the semiconductor layer, a second portion of the doped region is arranged between the light-shielding structure and the first surface of the semiconductor layer, and
      wherein the light-shielding structure is a hollow horizontal trench that is buried vertically between two regions of the semiconductor layer.

2. The image sensor device of claim 1, wherein the image sensor device is a backside illumination image sensor device, the first surface being a surface at which incoming light enters the semiconductor layer.

3. The image sensor device of claim 1, wherein the image sensor device is a front-side illumination image sensor device, the semiconductor layer having a second surface arranged opposite to the first surface, and the second surface being a surface at which incoming light enters the semiconductor layer.

4. The image sensor device of claim 1, wherein the light-shielding structure extends in a lateral direction over at least an entirety of a lateral extension of the storage node.

5. The image sensor device of claim 1, wherein the light-shielding structure comprises a buried horizontal slit.

6. The image sensor device of claim 1, further comprising:
   a doped region of the semiconductor layer, the doped region being adjacent to the storage node and configured to electrically shield the storage node to enhance charge carrier transfer from the photodiode to the storage node,
   wherein the light-shielding structure extends partially or completely within the doped region.

7. The image sensor device of claim 1, further comprising:
   a trench arranged vertically in the semiconductor layer between the photodiode and the storage node.

8. The image sensor device of claim 1, wherein an inner lateral edge of the storage node is aligned with an inner lateral edge of the doped region and with an inner lateral edge of the light-shielding structure.

9. The image sensor device of claim 1, further comprising:
   light scattering elements embedded within the semiconductor layer at the first surface of the semiconductor layer, the light scattering elements extending from the first surface of the semiconductor layer into the semiconductor layer.

10. The image sensor device of claim 9, wherein the light scattering elements are arranged in a center region of the pixel and overlap with the photodiode in the vertical dimension of the semiconductor layer.

11. The image sensor device of claim 1, further comprising:
    a vertical trench arranged between the first surface of the semiconductor layer and the light-shielding structure, wherein the vertical trench extends from the first surface of the semiconductor layer toward the light-shielding structure and is configured to reflect photons back toward a center region of the pixel,
    wherein the photodiode is arranged in the center region of the pixel.

12. The image sensor device of claim 11, wherein the vertical trench is a hollow vertical trench.

13. The image sensor device of claim 1, wherein an inner lateral edge of the storage node is aligned with an inner lateral edge of the doped region.

14. An image sensor device, comprising:
a pixel, the pixel comprising:
   a semiconductor layer having a first surface;
   a photodiode formed in the semiconductor layer and being configured to generate charge carriers based on light reaching the photodiode;
   a storage node formed in the semiconductor layer, the storage node being arranged so that the charge carriers generated in the photodiode are transferred to the storage node; and
   a light-shielding structure, the light-shielding structure being formed in the semiconductor layer and being disposed at least between the first surface of the semiconductor layer and the storage node so as to prevent at least part of the light traveling in the semiconductor layer away from the first surface from reaching the storage node,
wherein the light-shielding structure comprises a buried horizontal slit, and
wherein the buried horizontal slit comprises an electrically conductive coating arranged on a wall of the buried horizontal slit and the electrically conductive coating is configured to reflect incoming light impinging upon the wall.

15. An image sensor device, comprising:
a pixel, the pixel comprising:
   a semiconductor layer having a first surface;
   a photodiode formed in the semiconductor layer and being configured to generate charge carriers based on light reaching the photodiode;
   a storage node formed in the semiconductor layer, the storage node being arranged so that the charge carriers generated in the photodiode are transferred to the storage node; and
   a light-shielding structure, the light-shielding structure being formed in the semiconductor layer and being disposed at least between the first surface of the semiconductor layer and the storage node so as to prevent at least part of the light traveling in the semiconductor layer away from the first surface from reaching the storage node,
wherein the light-shielding structure comprises a row of buried cavities.

16. The image sensor device of claim 15, wherein the row of buried cavities comprises buried trenches, wherein each buried trench is oriented in a vertical direction and the buried trenches are laterally spaced apart from each other.

17. The image sensor device of claim 15, wherein the row of buried cavities comprises buried cavities having a round-shaped cross-section, wherein the buried cavities are laterally spaced apart from each other.

18. An image sensor device, comprising:
a pixel, the pixel comprising:
   a semiconductor layer having a first surface, a first doped region and a second doped region;
   a photodiode formed in the semiconductor layer and being configured to generate charge carriers based on light reaching the photodiode;
   a first storage node formed in the semiconductor layer, the first storage node being arranged so that some charge carriers generated in the photodiode are transferred to the first storage node, and the first storage node being at least partially embedded in the first doped region;
   a second storage node formed in the semiconductor layer, the second storage node being arranged so that some charge carriers generated in the photodiode are transferred to the second storage node, and the second storage node being at least partially embedded in the second doped region, wherein the photodiode is arranged laterally between the first storage node and the second storage node;
   a first light-shielding structure, the first light-shielding structure being formed in the semiconductor layer and being disposed at least between the first surface and the first storage node so as to prevent at least part of the light traveling in the semiconductor layer away from the first surface from reaching the first storage node;
   a second light-shielding structure, the second light-shielding structure being formed in the semiconductor layer and being disposed at least between the first surface and the second storage node so as to prevent at least part of the light traveling in the semiconductor layer away from the first surface from reaching the second storage node;
   a first vertical trench arranged between the first surface and the first light-shielding structure, wherein the first vertical trench extends from the first surface toward the first light-shielding structure and is configured to reflect photons back toward a center region of the pixel; and
   a second vertical trench arranged between the first surface and the second light-shielding structure, wherein the second vertical trench extends from the first surface toward the second light-shielding structure and is configured to reflect photons back toward the center region of the pixel,
wherein the photodiode is arranged in the center region of the pixel.

19. The image sensor device of claim 18, wherein the first vertical trench and the second vertical trench are hollow vertical trenches.

20. The image sensor device of claim 18, wherein the first light-shielding structure is a first horizontal cavity that is buried vertically between two first respective regions of the semiconductor layer, and
wherein the second light-shielding structure is a second horizontal cavity that is buried vertically between two second respective regions of the semiconductor layer, or
wherein the first light-shielding structure includes a first row of buried cavities that are arranged vertically between the two first respective regions of the semiconductor layer, and
wherein the second light-shielding structure includes a second row of buried cavities that are arranged vertically between the two second respective regions of the semiconductor layer.

21. The image sensor device of claim 18, further comprising:
   a third trench arranged laterally between the first storage node and the photodiode, the third trench extending from a second surface of the semiconductor layer into the semiconductor layer, the second surface being arranged opposite to the first surface; and
   a fourth trench arranged laterally between the second storage node and the photodiode, the fourth trench extending from the second surface into the semiconductor layer.

* * * * *